United States Patent
Hashizume

(10) Patent No.: US 7,682,456 B2
(45) Date of Patent: Mar. 23, 2010

(54) SUBSTRATE TREATMENT METHOD AND SUBSTRATE TREATMENT APPARATUS

(75) Inventor: Akio Hashizume, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1096 days.

(21) Appl. No.: 11/272,600

(22) Filed: Nov. 11, 2005

(65) Prior Publication Data
US 2006/0099339 A1    May 11, 2006

(30) Foreign Application Priority Data
Nov. 11, 2004    (JP) .............................. 2004-327930

(51) Int. Cl.
B08B 3/12        (2006.01)
B08B 6/00        (2006.01)
C25F 1/00        (2006.01)
C25F 3/30        (2006.01)

(52) U.S. Cl. .............................. 134/1; 134/1.1; 134/1.2; 134/1.3

(58) Field of Classification Search ........................ None
See application file for complete search history.

(56) References Cited

U.S. PATENT DOCUMENTS 5,922,136 A * 7/1999 Huang .......................... 134/2
2002/0197853 A1 * 12/2002 Nagai et al. ................. 438/639
2003/0134507 A1   7/2003 Aoki et al.
2004/0261817 A1 * 12/2004 Araki et al. ..................... 134/2

FOREIGN PATENT DOCUMENTS

| JP | 9-1093      | 1/1997 |
| JP | 2003-124316 | 4/2003 |
| JP | 2003-188138 | 7/2003 |

OTHER PUBLICATIONS

Japanese Office Action dated Jul. 9, 2009 in corresponding Japanese Patent Application No. 2004-327930 (in Japanese language).

* cited by examiner

*Primary Examiner*—Duy-Vu N Deo
(74) *Attorney, Agent, or Firm*—Ostrolenk Faber LLP

(57) ABSTRACT

A substrate treatment method is disclosed, which can effectively reduce the amount of charges accumulated on a substrate due to treatment of the substrate with a water-containing liquid. The method comprises the steps of: supplying a water-containing liquid to a substrate held generally horizontally by a substrate holding/rotating mechanism while rotating the substrate at a first rotation speed; and removing charges from the substrate after the water supplying step by performing a puddle process for a predetermined period by retaining a liquid film of a predetermined liquid on a surface of the substrate held generally horizontally by the substrate holding/rotating mechanism with the substrate being rotated at a second rotation speed lower than the first rotation speed or kept in a non-rotating state without further supplying the predetermined liquid to the liquid film.

7 Claims, 7 Drawing Sheets

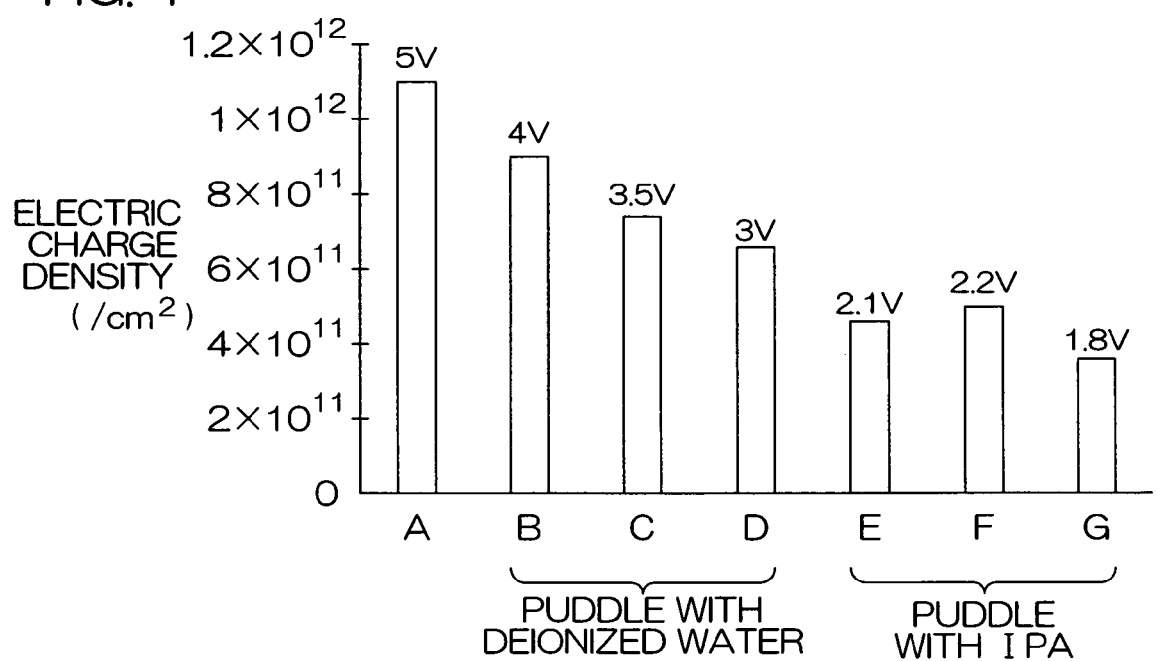

SUBSTRATE TREATMENT METHOD AND SUBSTRATE TREATMENT APPARATUS

BACKGROUND OF THE INVENTION

1. Field of the Invention

The present invention relates to a substrate treatment method and a substrate treatment apparatus which are adapted to supply a water-containing liquid to a substrate held by a substrate holding/rotating mechanism while rotating the substrate.

2. Description of the Related Art

Substrate treatment apparatuses for use in production processes for semiconductor devices and liquid crystal display devices include those of single substrate treatment type which are adapted to treat a single substrate at a time. Such a single-substrate treatment apparatus includes, for example, a spin chuck which rotates a substrate held thereon, a chemical nozzle which supplies a chemical to the substrate held on the spin chuck, and a deionized water nozzle which supplies deionized water to the substrate held on the spin chuck. With this arrangement, a chemical treatment process is performed by supplying the chemical to the substrate while rotating the spin chuck, then a rinsing process is performed by stopping the supply of the chemical and supplying the deionized water to the substrate while rotating the spin chuck for rinsing off the chemical from the surface of the substrate, and a drying process is performed by stopping the supply of the deionized water and rotating the spin chuck at a higher speed for spinning off the deionized water from the substrate.

In the rinsing process, the substrate is liable to be electrostatically charged due to friction between the substrate and the deionized water and between the deionized water and air, resulting in malfunction of devices formed on the substrate.

One approach to this problem is to reduce the amount of the charges on the substrate by using deionized water containing carbon dioxide gas dissolved therein in the rinsing process (see Japanese Unexamined Patent Publication (KOKAI) No. HEI9(1997)-1093).

However, further reduction of the substrate charge amount is demanded in the market. Unfortunately, it is impossible to meet the market demand simply by using the $CO_2$-containing deionized water (carbonated water) in the rinsing process.

SUMMARY OF THE INVENTION

It is an object of the present invention to provide a substrate treatment method and a substrate treatment apparatus which can effectively reduce the amount of charges accumulated on a substrate due to treatment of the substrate with a water-containing liquid.

A substrate treatment method according to the present invention comprises the steps of: supplying a water-containing liquid to a substrate held generally horizontally by a substrate holding/rotating mechanism while rotating the substrate at a first rotation speed; and removing charges from the substrate after the water supplying step by performing a puddle process for a predetermined period by retaining a liquid film of a predetermined liquid on a surface of the substrate held generally horizontally by the substrate holding/rotating mechanism with the substrate being rotated at a second rotation speed lower than the first rotation speed or kept in a non-rotating state without further supplying the predetermined liquid to the liquid film.

When the water-containing liquid is supplied to the substrate being rotated, the substrate is liable to be electrostatically charged mainly due to friction between the water and the substrate. In the present invention, the charge removing step is performed for removing the charges from the substrate after the water supplying step is performed by supplying the water-containing liquid to the substrate held generally horizontally while rotating the substrate at the first rotation speed. In the charge removing step, the substrate is rotated at the second rotation speed lower than the rotation speed employed in the water supplying step, or the rotation of the substrate is stopped. In this state, the so-called puddle process is performed by retaining the liquid film of the predetermined liquid on the surface of the substrate. At this time, the predetermined liquid is no longer supplied to the liquid film.

Thus, the liquid of the liquid film on the substrate surface does not move relative to the substrate, so that the substrate is less liable to be electrostatically charged. That is, the amount of charges released from the substrate per unit time is greater than the amount of the charges accumulated on the substrate per unit time, so that the charge removal from the substrate proceeds. The mechanism of the release of the charges from the substrate is not necessarily clarified, but is supposedly such that the charges are released from the substrate surface into the air via the liquid film.

The water-containing liquid may be deionized water or a liquid containing so-called functional water. Examples of the functional water include carbonated water, hydrogenated water (reduction water), ozone water and electrolytically ionized water.

The predetermined period for the puddle process is preferably not shorter than 3 seconds, even preferably not shorter than 5 seconds. Thus, the charges can be sufficiently removed from the substrate electrostatically charged in the water supplying step.

The substrate holding/rotating mechanism may be a spin chuck which holds a single substrate generally horizontally and rotates the substrate about a vertical axis.

The predetermined liquid may be the water-containing liquid. In this case, the same type of liquid as the liquid to be supplied to the substrate in the water supplying step may be used in the charge removing step. Thus, the charge removal from the substrate can be achieved with a simple construction.

More specifically, the water supplying step may include the step of supplying the water-containing liquid to the substrate from a water supply nozzle. In this case, the method preferably further comprises the step of reducing the rotation speed of the substrate from the first rotation speed to the second rotation speed or stopping the rotation of the substrate, and stopping the supply of the liquid from the water supply nozzle after the water supplying step before the charge removing step.

The predetermined liquid may be an organic solvent. In this case, the charge removal effect can be improved as compared with the case in which the deionized water or the carbonated water is used for formation of the liquid film in the puddle process. The reason for this is not necessarily clear, but is supposedly such that a contact area between the liquid film and the ambient air is substantially increased due to the volatility of the organic solvent and the charges are efficiently released from the substrate into the air via the liquid film.

Examples of the organic solvent include isopropyl alcohol (IPA), ethanol, acetone and methyl isobutyl ketone (MIBK).

Where the water supplying step includes the step of supplying the water-containing liquid to the substrate from the water supply nozzle and the organic solvent is used in the charge removing step, the method preferably further comprises, between the water supplying step and the charge removing step, the steps of stopping the supply of the liquid from the water supply nozzle, supplying the organic solvent to the surface of the substrate from an organic solvent nozzle, reducing the rotation speed of the substrate from the first rotation speed to the second rotation speed or stopping the rotation of the substrate, and stopping the supply of the organic solvent to the substrate from the organic solvent nozzle.

In this case, the water-containing liquid on the substrate surface is replaced with the organic solvent by stopping the supply of the liquid from the water supply nozzle and starting the supply of the organic solvent to the substrate surface from the organic solvent nozzle after the water supplying step. Thereafter, the rotation speed of the substrate is reduced from the first rotation speed to the second rotation speed or the rotation of the substrate is stopped, and the supply of the organic solvent to the substrate from the organic solvent nozzle is stopped. Thus, the liquid film is formed and retained on the substrate surface, and the liquid is no longer supplied to the liquid film. Thus, the charges can be released from the substrate via the organic solvent film formed on the substrate surface. At this time, the organic solvent of the liquid film does not move relative to the substrate, so that the amount of the charges released per unit time is greater than the amount of the charges accumulated per unit time due to the friction. Therefore, the charge removal from the substrate efficiently proceeds.

The method preferably further comprises the step of drying the substrate by spinning off the liquid from the substrate surface by rotating the substrate at a third rotation speed higher than the first rotation speed by the substrate holding/rotating mechanism after the charge removing step. Thus, the liquid on the substrate surface is spun off by a centrifugal force for drying the substrate after the charge removing step.

A substrate treatment apparatus according to the present invention comprises a substrate holding/rotating mechanism which rotates a substrate while holding the substrate generally horizontally, a water supply nozzle for supplying a water-containing liquid to the substrate held by the substrate holding/rotating mechanism, and a control unit which performs the steps of supplying the water-containing liquid to the substrate from the water supply nozzle while rotating the substrate at a first rotation speed by controlling the substrate holding/rotating mechanism, and removing charges from the substrate after the water supplying step by performing a puddle process for a predetermined period by retaining a liquid film of a predetermined liquid on a surface of the substrate with the substrate being rotated at a second rotation speed lower than the first rotation speed or kept in a non-rotating state by controlling the substrate holding/rotating mechanism without further supplying the predetermined liquid to the liquid film.

With this arrangement, the puddle process is performed by retaining the liquid film on the substrate surface without further supplying the predetermined liquid to the liquid film after the treatment of the substrate with the water-containing liquid.

The foregoing and other objects, features and effects of the present invention will become more apparent from the following detailed description of the preferred embodiments with reference to the attached drawings.

BRIEF DESCRIPTION OF THE DRAWINGS

FIG. 7 is a diagram showing the results of an experiment conducted by the inventor of the present invention.

DETAILED DESCRIPTION OF PREFERRED EMBODIMENTS

Figure 1:
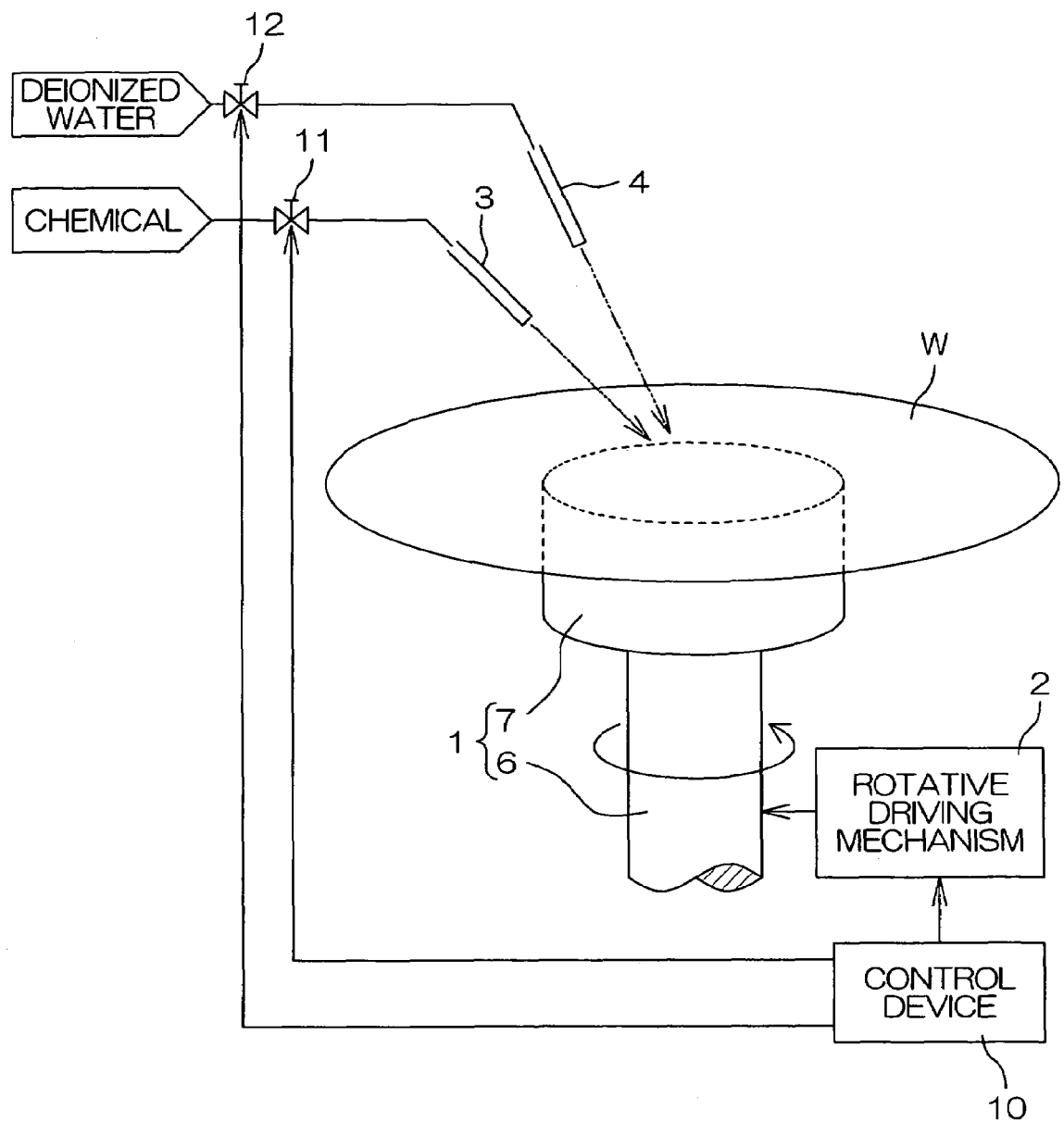
FIG. 1 is a schematic diagram for explaining the construction of a substrate treatment apparatus according to a first embodiment of the present invention.

FIG. 1 is a schematic diagram for explaining the construction of a substrate treatment apparatus according to a first embodiment of the present invention. The substrate treatment apparatus is of a single substrate treatment type for treating a single substrate W such as a semiconductor wafer (a generally round substrate in this embodiment) at a time. The substrate treatment apparatus includes a spin chuck 1 as a substrate holding/rotating mechanism which rotates the substrate W while holding the substrate W generally horizontally, a rotative driving mechanism 2 which applies a rotation force to the spin chuck 1, a chemical nozzle 3 which supplies a chemical to the substrate W held and rotated by the spin chuck 1, and a deionized water nozzle 4 (water supply nozzle) which supplies deionized water to the substrate W held and rotated by the spin chuck 1.

The spin chuck 1 includes a rotation shaft 6 disposed generally vertically and a substrate suction portion 7 connected to an upper end of the rotation shaft 6, and is adapted to suck a lower surface center portion of the substrate W by vacuum suction to hold the substrate W thereon. The rotation force from the rotative driving mechanism 2 is transmitted to the rotation shaft 6. The rotative driving mechanism 2 includes a motor and the like, and is controlled to be driven by a control device 10 (control unit). Thus, the rotative driving mechanism 2 is controlled to change the rotation speed of the spin chuck 1 and stop the rotation of the spin chuck 1.

The chemical is supplied to the chemical nozzle 3 from a chemical supply source through a chemical valve 11. Examples of the chemical to be supplied to the chemical nozzle 3 from the chemical supply source include an etching liquid such as fluoric acid and a polymer removing liquid for removing a resist remaining on a surface of the substrate W.

The deionized water is supplied to the deionized water nozzle 4 from a deionized water supply source through a deionized water valve 12. Instead of the deionized water, so-called functional water may be supplied to the surface of the substrate W from the nozzle 4. The functional water is deionized water imparted with a certain function, and examples of the functional water include carbonated water, hydrogenated water (reduction water), ozone water and electrolytically ionized water.

The chemical valve 11 and the deionized water valve 12 are controlled to be opened and closed by the control device 10.

Figure 2:
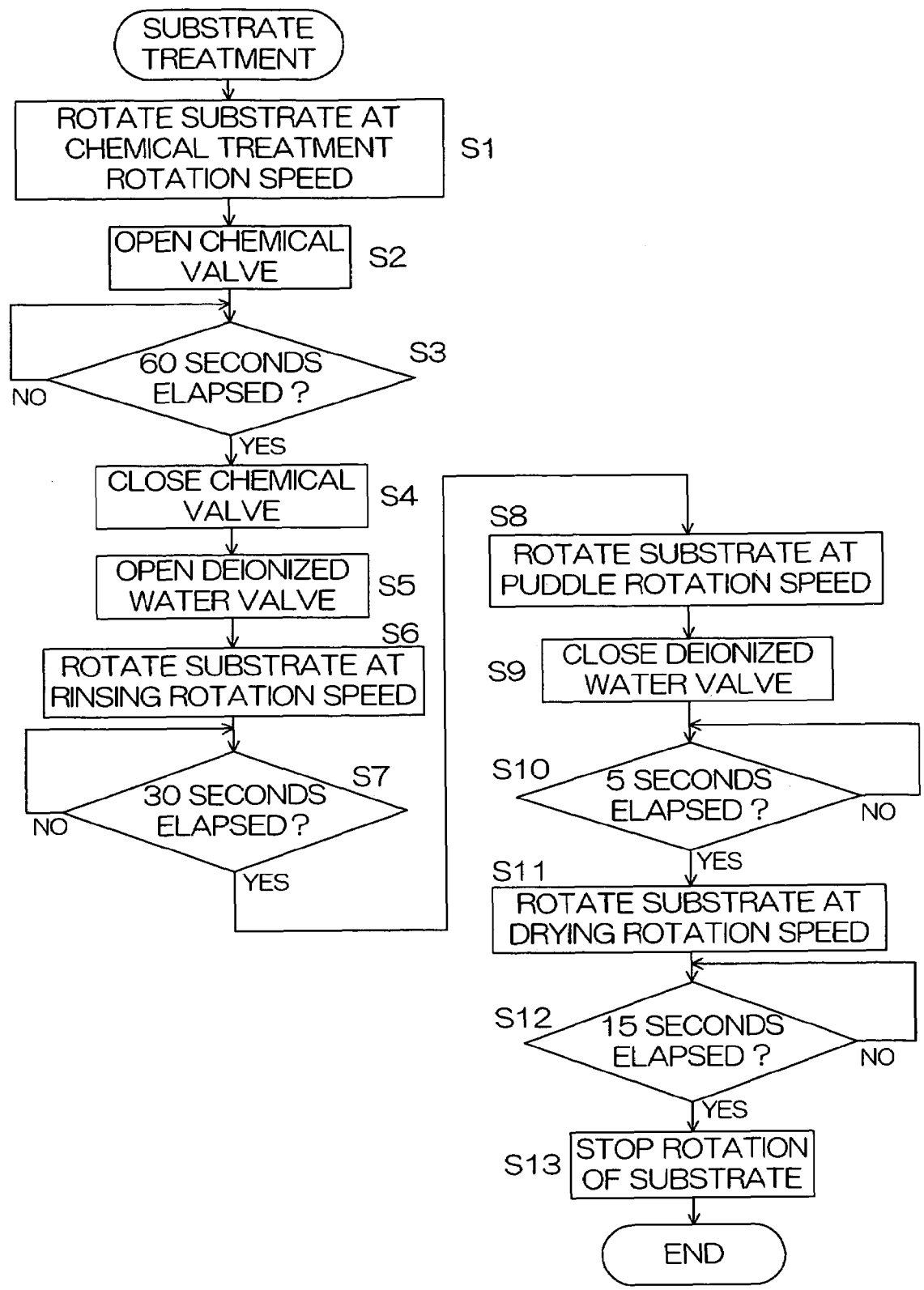
FIG. 2 is a flow chart for explaining a substrate treatment process to be performed by the substrate treatment apparatus of FIG. 1.
Figure 3:
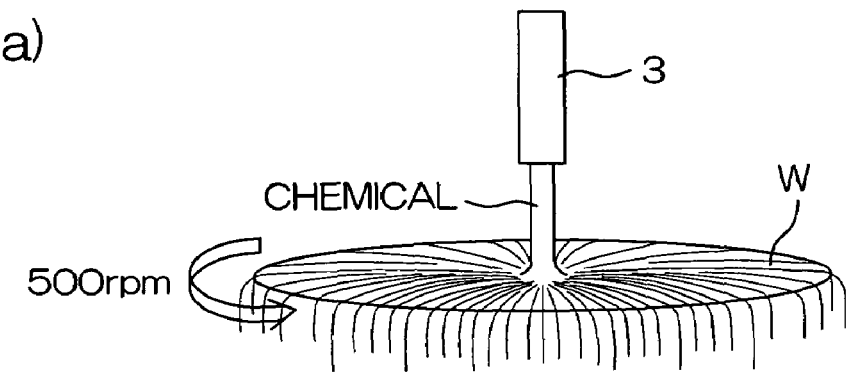
FIGS. 3(a) to 3(d) are schematic diagrams for explaining the flow of the substrate treatment process according to the first embodiment.
Figure 3:
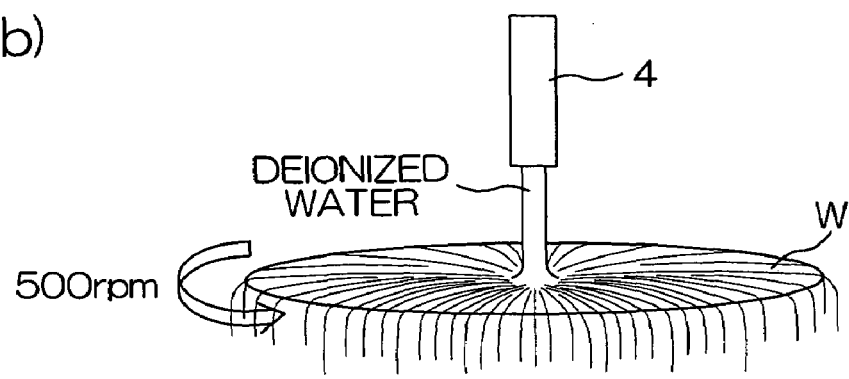
Figure 3:
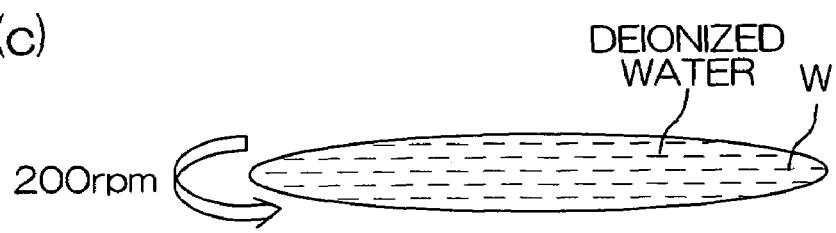
Figure 3:

FIG. 2 is a flow chart for explaining a substrate treatment process to be performed by the substrate treatment apparatus of FIG. 1. FIGS. 3(a) to 3(d) are schematic diagrams for explaining the flow of the substrate treatment process.

When an untreated substrate W is loaded on the spin chuck 1 by a substrate transport robot, the substrate W is sucked by the substrate suction portion 7 to be held on the spin chuck 1. In this state, the rotative driving mechanism 2 is controlled by the control device 10 to apply a rotation force to the spin chuck 1 to rotate the substrate W at a substrate rotation speed (chemical treatment rotation speed) RC for treatment of the substrate W with the chemical (Step S1). The chemical treatment rotation speed RC is, for example, 500 rpm.

With the substrate W being rotated at the chemical treatment rotation speed RC, the control device 10 opens the chemical valve 11 (Step S2). Thus, the chemical is supplied from the chemical nozzle 3 to the surface of the substrate W being rotated. The chemical nozzle 3 is disposed so as to supply the chemical toward the rotation center of the substrate W. Therefore, the chemical reaching the surface of the substrate W spreads radially outward from the rotation center throughout the entire upper surface of the substrate W by a centrifugal force. Thus, the entire upper surface of the substrate W is treated with the chemical (see FIG. 3(a)).

This state is maintained for a predetermined period (e.g., 60 seconds) (Step S3), and then the control device 10 closes the chemical valve 11 (Step S4). Thus, the supply of the chemical to the surface of the substrate W is stopped.

In turn, the control device 10 opens the deionized water valve 12 (Step S5). Thus, the deionized water is supplied to the upper surface of the substrate W from the deionized water nozzle 4. The deionized water nozzle 4 is disposed so as to spout the deionized water toward the rotation center of the substrate W. Therefore, the deionized water reaching the upper surface of the substrate W spreads radially outward from the rotation center throughout the entire substrate W by a centrifugal force (see FIG. 3(b)). Thus, the chemical on the entire upper surface of the substrate W is replaced with the deionized water, whereby a deionized water rinsing process is performed for rinsing the substrate W with the deionized water. The amount of the deionized water to be spouted from the deionized water nozzle 4 is, for example, about 800 ml.

At this time, the control device 10 controls the rotative driving mechanism 2 to change the rotation speed of the spin chuck 1 (i.e., the rotation speed of the substrate W) to a rinsing rotation speed RR (Step S6). The rinsing rotation speed RR is, for example, 500 rpm.

This state is maintained for a predetermined period (e.g., 30 seconds) (Step S7).

Thereafter, the control device 10 controls the rotative driving mechanism 2 to reduce the rotation speed of the spin chuck 1 (i.e., the rotation speed of the substrate W) to a puddle rotation speed RP (Step S8). The puddle rotation speed RP is lower than the rinsing rotation speed RR, and is 200 rpm in this embodiment.

After the rotation speed of the substrate W is reduced to the puddle rotation speed RP, the control device 10 closes the deionized water valve 12 (Step S9). Thus, a liquid film of the deionized water is retained on the surface of the substrate W being rotated horizontally at the lower speed for performing a deionized water puddle process (see FIG. 3(c)). This state is maintained for a predetermined period (e.g., 5 seconds) (Step S10).

Thereafter, the control device 10 increases the rotation speed of the spin chuck 1 to a drying rotation speed RD (e.g., 4000 rpm) (Step S11). The drying rotation speed RD is further higher than the rinsing rotation speed RR. Liquid droplets on the surface of the substrate W are spun off outward of the substrate W by a centrifugal force generated by the higher speed rotation of the substrate W at the drying rotation speed RD. Thus, the substrate W is dried (see FIG. 3(d)). After the drying process is thus performed for a predetermined drying period (e.g., 15 seconds) (Step S12), the control device 10 controls the rotative driving mechanism 2 to stop the rotation of the spin chuck 1 (Step S13). Thus, the treatment of the single substrate W is completed, and then the treated substrate W is unloaded from the spin chuck 1 by the substrate transport robot.

In the substrate treatment process according to this embodiment, the rotation speed of the substrate W is reduced to the puddle rotation speed RP after the deionized water rinsing process (Steps S5 to S7), and then the supply of the deionized water is stopped. Thus, the liquid film of the deionized water is retained on the substrate W for a predetermined period (e.g., 5 seconds), so that the speed of the deionized water of the liquid film relative to the substrate W is virtually zero. In this state, the substrate W is hardly electrostatically charged due to the friction between the substrate Wand the deionized water, so that a released charge amount per unit time is greater than an accumulated charge amount per unit time. As a result, the charge removal from the substrate W charged in the deionized water rinsing process efficiently proceeds.

Figure 4:
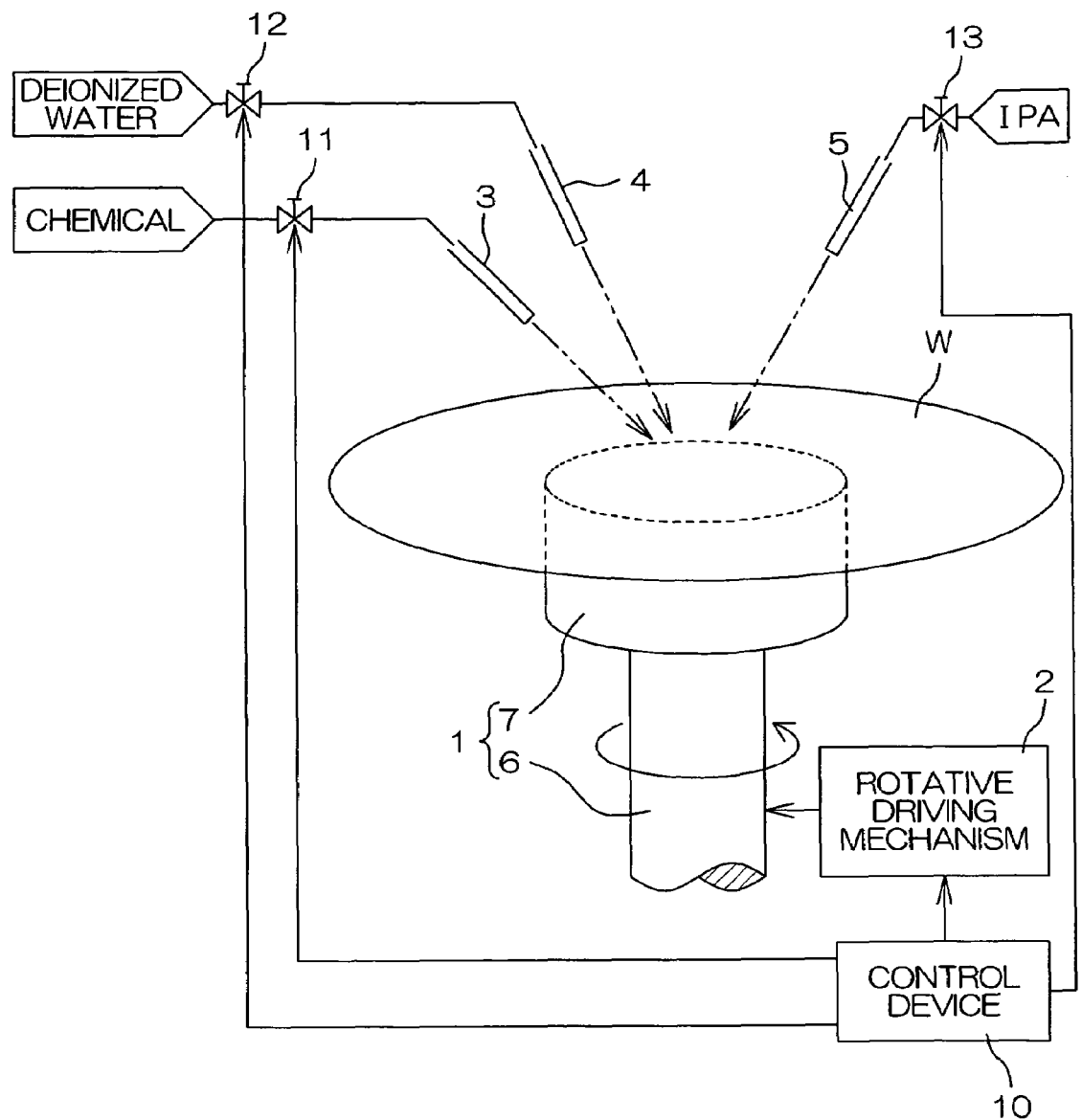
FIG. 4 is a schematic diagram for explaining the construction of a substrate treatment apparatus according to a second embodiment of the present invention.

FIG. 4 is a schematic diagram for explaining the construction of a substrate treatment apparatus according to a second embodiment of the present invention. In FIG. 4, components corresponding to those shown in FIG. 1 will be denoted by the same reference characters as in FIG. 1. The substrate treatment apparatus according to this embodiment includes an organic solvent nozzle 5 for supplying an organic solvent to the substrate W held by the spin chuck 1 in addition to the components shown in FIG. 1. The organic solvent is supplied to the organic solvent nozzle 5 from an organic solvent supply source via an organic solvent valve 13. The organic solvent valve 13 is controlled to be opened and closed by the control device 10.

The organic solvent to be supplied from the organic solvent supply source may be, for example, isopropyl alcohol (IPA).

Figure 5:
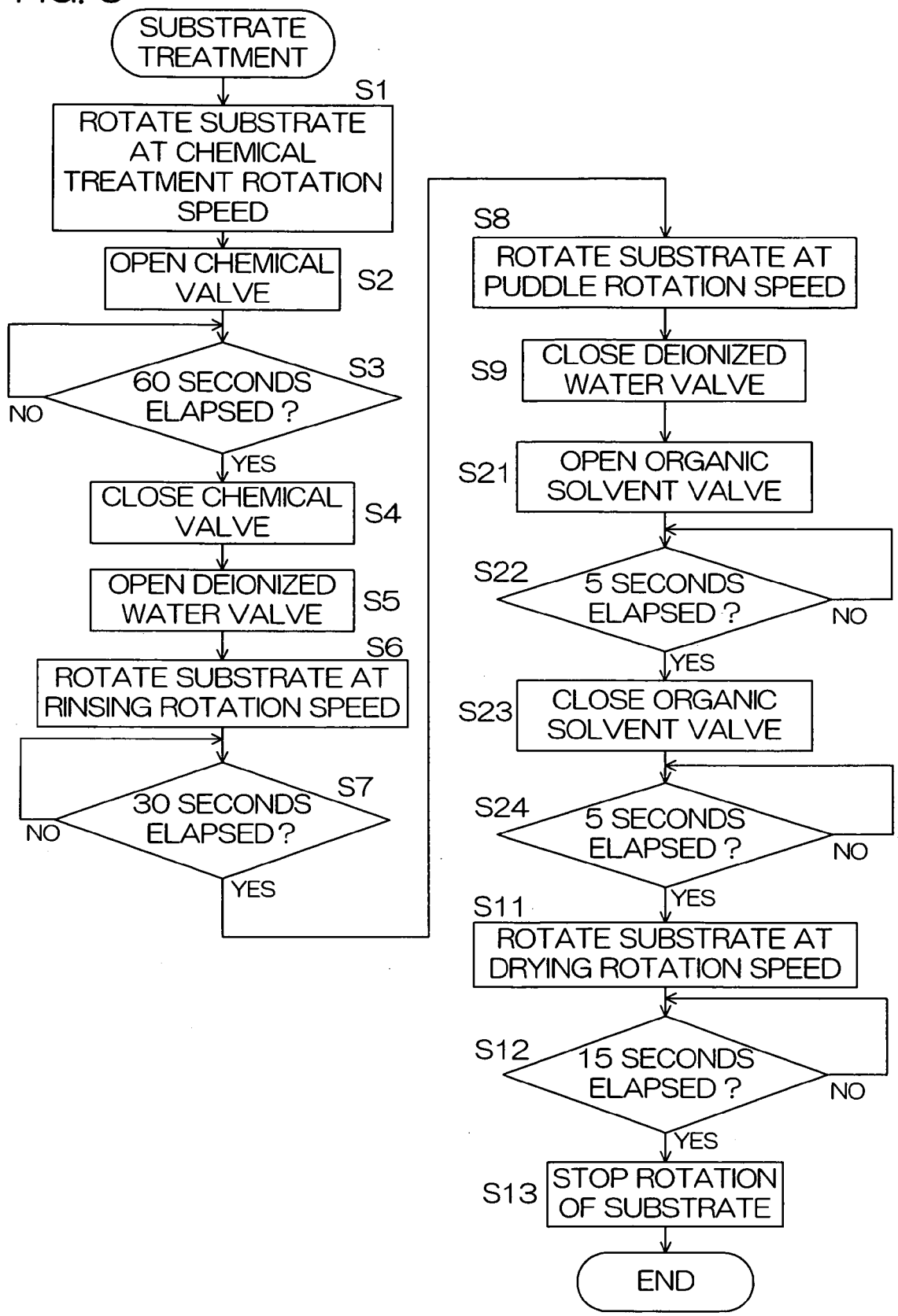
FIG. 5 is a flow chart for explaining a substrate treatment process to be performed by the substrate treatment apparatus of FIG. 4.

FIG. 5 is a flow chart for explaining a substrate treatment process to be performed by the substrate treatment apparatus of FIG. 4, and FIGS. 6(a) to 6(e) are schematic diagrams for explaining the flow of the substrate treatment process. In FIG. 5, steps to be performed in the same manner as the steps shown in FIG. 2 are denoted by the same step numbers as in FIG. 2.

Figure 6:
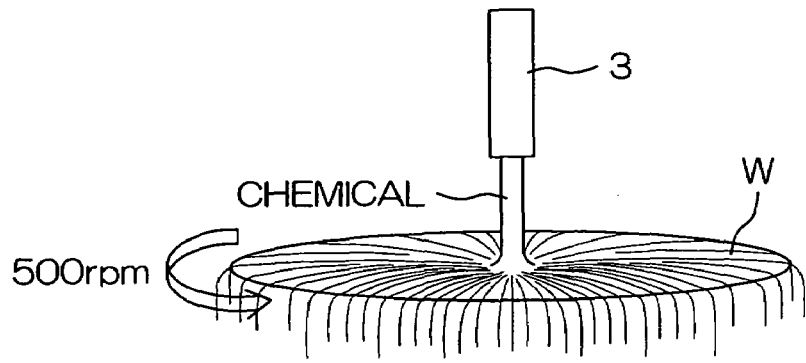
FIGS. 6(a) to 6(e) are schematic diagrams for explaining the flow of the substrate treatment process according to the second embodiment.
Figure 6:
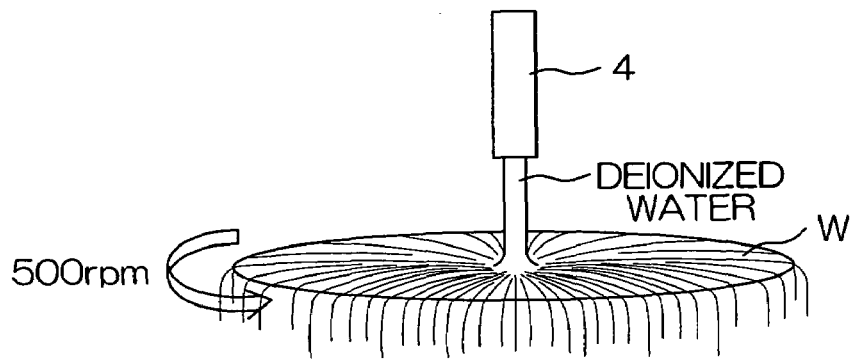
Figure 6:
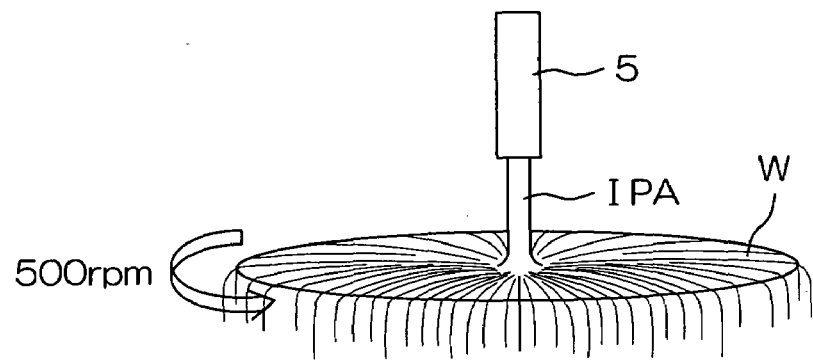
Figure 6:
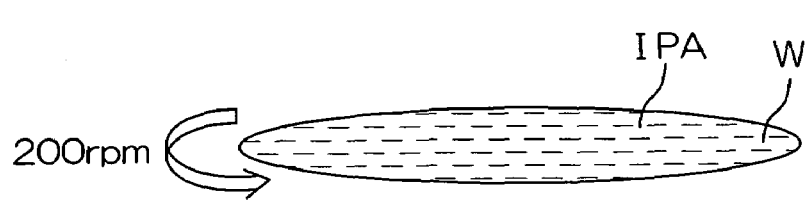
Figure 6:

As is apparent from a comparison between FIGS. 2 and 5, the organic solvent is supplied to the surface of the substrate W (FIG. 6(c)) and an organic solvent puddle process is performed by forming a liquid film of the organic solvent on the substrate W (FIG. 6(d)) between the deionized water rinsing process (Steps S5 to S9, FIG. 6(b)) and the spin drying process (Steps S11 to S13, FIG. 6(e)) after the chemical treatment process (Steps S2 to S4, FIG. 6(a)).

More specifically, after closing the deionized water valve 12 (Step S9), the control device 10 opens the organic solvent valve 13 (Step S21) to supply the organic solvent from the organic solvent nozzle 5 toward the surface of the substrate W being rotated at the puddle rotation speed RP for a predetermined period (e.g., 5 seconds) (Step S22). The organic solvent nozzle 5 spouts the organic solvent, for example, toward the rotation center of the substrate W. Therefore, the organic solvent reaching the upper surface of the substrate W spreads throughout the entire upper surface of the substrate W by a centrifugal force (see FIG. 6(c)). Thus, the deionized water remaining on the substrate W is replaced with the organic solvent. The amount of the organic solvent spouted from the organic solvent nozzle 5 is, for example, about 600 ml.

Thereafter, the control device 10 closes the organic solvent valve 13 (Step S23). Thus, a liquid film of the organic solvent is formed on the substrate W being rotated at the puddle rotation speed RP without additional supply of the organic solvent to the organic solvent film (see FIG. 6(d)). As a result, the organic solvent of the liquid film on the substrate W does not move relative to the substrate W, so that the substrate W is hardly triboelectrically charged. That is, the amount of charges released from the substrate W per unit time is greater than the amount of charges accumulated on the substrate W per unit time. Therefore, the charge removal from the substrate W efficiently proceeds.

This state is maintained for a predetermined period (e.g., 5 seconds), and then the control device 10 performs the spin drying process starting from the Step S11 (see FIG. 6(e)). Thus, the organic solvent is spun off from the substrate W by a centrifugal force.

In this embodiment, the puddle process is thus performed for the charge removal from the substrate W by forming the liquid film of the organic solvent. Since the organic solvent is volatile, a contact area between the liquid film and the ambient air is substantially increased. As a result, the charges are speedily released from the substrate W through the liquid film of the organic solvent.

FIG. 7 is a diagram showing the results of an experiment conducted by the inventor of the present invention. The surface charge densities of substrates subjected to the deionized water rinsing process and the spin drying process under various conditions were measured, and the results of the measurement are shown in FIG. 7.

A measurement result A was obtained when the substrate treatment process is performed by performing the deionized water rinsing process with the use of carbonated water prepared by dissolving carbon dioxide gas in deionized water while rotating the substrate at a substrate rotation speed of 500 rpm, and performing the spin drying process without performing the puddle process (according to the prior art). In this case, the surface charge density was about $1.1 \times 10^{12}$ (/cm$^2$), and a substrate surface potential corresponding to the surface charge density was about 5V.

Measurement results B, C and D were obtained when the substrate treatment process was performed by performing the deionized water rinsing process with the use of the carbonated water, reducing the rotation speed of the substrate W to puddle rotation speeds RP of 200 rpm, 100 rpm and 30 rpm, respectively, performing the puddle process with the use of the carbonated water, and performing the spin drying process (according to the first embodiment).

In the measurement results B, C and D, the surface charge densities were all lower than $1.0 \times 10^{12}$ (/cm$^2$), and it is deduced that the surface charge density is reduced as the puddle rotation speed RP is reduced. In the measurement results B, C and D, the surface charge densities were about $8.8 \times 10^{11}$ (/cm$^2$), about $7.5 \times 10^{11}$ (/cm$^2$) and about $6.5 \times 10^{11}$ (/cm$^2$), respectively, which correspond to surface potentials of 4V, 3.5V and 3V, respectively.

Measurement results E, F and G were obtained when the substrate treatment process was performed by performing the deionized water rinsing process with the use of the carbonated water, performing the puddle process with the use of IPA as the organic solvent while rotating the substrate W at puddle rotation speeds RP of 200 rpm, 100 rpm and 30 rpm, respectively, and performing the spin drying process (according to the second embodiment).

These measurement results show that the surface charge density is generally reduced as the puddle rotation speed RP is reduced, though the surface charge density was higher when the puddle rotation speed RP was 200 rpm (measurement result E) than when the puddle rotation speed RP was 100 rpm (measurement result F). As is apparent from a comparison between the measurement results B, C, D and the measurement results E, F, G, the use of the organic solvent facilitates the charge removal.

In the measurement results E, F and G, the surface charge densities were about $4.7 \times 10^{11}$ (/cm$^2$), about $4.9 \times 10^{11}$ (/cm$^2$) and about $3.8 \times 10^{11}$ (/cm$^2$), respectively, which correspond to surface potentials of 2.1V, 2.2V and 1.8V, respectively.

In the experiment with measurement results thereof shown in FIG. 7, semiconductor wafers each having an oxide film (e.g., having a thickness of 100 nm) formed on a surface thereof were used as the substrate W. It is herein assumed that the oxide film on the wafer defines a parallel plate capacitor. In this case, the following expression is satisfied:

$$Q = CV = \epsilon_{OX} \epsilon_0 SV/d$$

wherein Q is a charge amount, C is a capacitance, V is a surface potential, $\epsilon_{OX}$ is the relative permittivity of the oxide film, $\epsilon_0$ is the permittivity of vacuum, d is the thickness of the oxide film and S is the area of the oxide film.

In this case, the surface charge density is determined by dividing the charge amount Q by an elementary charge amount e and the area S of the oxide film and, therefore, calculated from the following expression:

$$\text{Surface charge density} = \epsilon_{OX} \epsilon_0 V/d/e$$

The surface charge density is calculated as follows by assigning actual values to the respective constants. The thickness of the oxide film is herein expressed in units of Å.

$$\text{Surface charge density} = 2.15528 \times 10^{14} V/d$$

Thus, the surface charge density can be determined by measuring the surface potential of the oxide film on the wafer.

While the two embodiments of the present invention have thus been described, the invention may be embodied in any other ways. In the embodiments described above, the substrate W is rotated at the lower speed in the puddle process, but the rotation of the substrate W may be completely stopped. Where the substrate W is rotated at the lower speed in the puddle process, the upper limit of the rotation speed of the substrate W may be determined based on whether the liquid film can be retained on the substrate W for the predetermined period (e.g., not shorter than 3 seconds, preferably not shorter than 5 seconds). In the puddle process, the lower speed rotation is preferable to the complete stop of the rotation of the substrate W. Thus, particles are prevented from remaining at fixed positions on the substrate W to adhere to the substrate surface or such a phenomenon is suppressed, though some of the liquid on the substrate W is spilled out.

While the present invention has been described in detail by way of the embodiments thereof, it should be understood that these embodiments are merely illustrative of the technical principles of the present invention but not limitative of the same. The spirit and scope of the present invention are to be limited only by the appended claims.

This application corresponds to Japanese Patent Application No. 2004-327930 filed with the Japanese Patent Office on Nov. 11, 2004, the entire disclosure of which is incorporated herein by reference.

What is claimed is:

1. A substrate treatment method, comprising the steps of:
supplying a water-containing liquid to a substrate held generally horizontally by a substrate holding/rotating mechanism while rotating the substrate at a first rotation speed; and
removing charges from the substrate after the water-containing liquid supplying step by performing a puddle process for a predetermined period by retaining a liquid film of a predetermined liquid on a surface of the substrate held generally horizontally by the substrate holding/rotating mechanism with the substrate being rotated at a second rotation speed lower than the first rotation speed or kept in a non-rotating state without further supplying the predetermined liquid to the liquid film.

2. A substrate treatment method as set forth in claim 1, wherein
the predetermined liquid is the water-containing liquid.

3. A substrate treatment method as set forth in claim 2, wherein
the water supplying step includes the step of supplying the water-containing liquid to the substrate from a water supply nozzle,
the method further comprising the step of reducing the rotation speed of the substrate from the first rotation speed to the second rotation speed or stopping the rotation of the substrate, and stopping the supply of the liquid from the water supply nozzle between the water-containing liquid supplying step and the charge removing step.

4. A substrate treatment method as set forth in claim 1, wherein
the predetermined liquid is an organic solvent.

5. A substrate treatment method as set forth in claim 4, wherein
the water supplying step includes the step of supplying the water-containing liquid to the substrate from a water supply nozzle,
the method further comprising, between the water supplying step and the charge removing step, the steps of:
stopping the supply of the liquid from the water supply nozzle;
supplying the organic solvent to the surface of the substrate from an organic solvent nozzle;
reducing the rotation speed of the substrate from the first rotation speed to the second rotation speed or stopping the rotation of the substrate; and
stopping the supply of the organic solvent to the substrate from the organic solvent nozzle.

6. A substrate treatment method as set forth in claim 1, further comprising the step of drying the substrate by spinning off the liquid from the substrate surface by rotating the substrate at a third rotation speed higher than the first rotation speed by the substrate holding/rotating mechanism after the charge removing step.

7. A substrate treatment method as set forth in claim 1, wherein in the puddle process, the liquid film of the predetermined liquid is retained on the surface of the substrate held by the substrate holding/rotating mechanism, and substantially no relative movement occurs between the surface of the substrate and the predetermined liquid constituting the liquid film during the puddle process.

* * * * *